United States Patent
Mohammad (10) Patent No.: US 8,737,117 B2
(45) Date of Patent: May 27, 2014

(54) SYSTEM AND METHOD TO READ A MEMORY CELL WITH A COMPLEMENTARY METAL-OXIDE-SEMICONDUCTOR (CMOS) READ TRANSISTOR

(75) Inventor: Baker S. Mohammad, Austin, TX (US)

(73) Assignee: QUALCOMM Incorporated, San Diego, CA (US)

( * ) Notice: Subject to any disclaimer, the term of this patent is extended or adjusted under 35 U.S.C. 154(b) by 337 days.

(21) Appl. No.: 12/774,181

(22) Filed: May 5, 2010

(65) Prior Publication Data

US 2011/0273943 A1   Nov. 10, 2011

(51) Int. Cl.
*G11C 11/412* (2006.01)

(52) U.S. Cl.
USPC .................. 365/154; 365/189.19; 365/230.06

(58) Field of Classification Search
CPC ... G11C 11/412; G11C 11/417; G11C 11/419
USPC .......... 365/154, 156, 189.19, 230.06
See application file for complete search history.

(56) References Cited

U.S. PATENT DOCUMENTS

| | | | | |
|---|---|---|---|---|
| 5,161,120 A * | 11/1992 | Kajimoto et al. | ........ | 365/189.05 |
| 5,319,595 A * | 6/1994 | Saruwatari | ........ | 365/189.16 |
| 6,707,707 B2 * | 3/2004 | Marr | ........ | 365/154 |
| 6,888,758 B1 * | 5/2005 | Hemink et al. | ........ | 365/185.22 |
| 7,120,080 B2 | 10/2006 | Lee et al. | | |
| 7,495,948 B2 | 2/2009 | Suzuki et al. | | |
| 7,499,312 B2 | 3/2009 | Matick et al. | | |
| 7,813,161 B2 * | 10/2010 | Luthra | ........ | 365/154 |
| 7,952,955 B2 * | 5/2011 | Kodama | ........ | 365/230.06 |

(Continued)

FOREIGN PATENT DOCUMENTS

GB   2460049 A   11/2009

OTHER PUBLICATIONS

Kim, Daeyeon et al. "Low Power Circuit Design Based on Heterojunction Tunneling Transistors (HETTs)," Proceedings of the 14th ACM/IEEE International Symposium on Low Power Electronics and Design, San Fancisco, CA, USA, Aug. 19-21, 2009, pp. 219-224.
Badrudduza, Sayeed A. et al. "Six and Seven Transistor Leakage Suppressed SRAM Cells with Improved Read Stability," IEEE Custom Integrated Circuits Conference (CICC), San Jose, CA, USA, Sep. 16-19, 2007, pp. 225-228.

(Continued)

*Primary Examiner* — Harry W Byrne
*Assistant Examiner* — Lance Reidlinger
(74) *Attorney, Agent, or Firm* — Peter Michael Kamarchik; Nicholas J. Pauley; Joseph Agusta (57) ABSTRACT

A system and method to manage leakage of a complementary metal-oxide-semiconductor (CMOS) read transistor in a memory cell. In a particular embodiment, a memory cell is disclosed that includes a storage element and a complementary metal-oxide-semiconductor (CMOS) read transistor. The CMOS read transistor includes a first terminal coupled to a read word line, a second terminal coupled to a read bit line, and a third terminal coupled to the storage element. During a non-read operating time, the read word line and the read bit line are both maintained at substantially the same voltage level. During a read operation, the read word line is maintained at a particular voltage level until after a voltage representing data stored at the storage element is sensed by the CMOS read transistor.

25 Claims, 6 Drawing Sheets

(56) References Cited

U.S. PATENT DOCUMENTS

| | | |
|---|---|---|
| 8,111,542 B2 * | 2/2012 | Wu et al. .................. 365/154 |
| 2002/0048201 A1 * | 4/2002 | Garg ........................ 365/200 |
| 2006/0227595 A1 | 10/2006 | Chuang et al. |
| 2008/0117700 A1 * | 5/2008 | Nakamura ................ 365/205 |
| 2008/0144360 A1 * | 6/2008 | Takahashi ................. 365/149 |
| 2009/0161410 A1 | 6/2009 | Houston |
| 2009/0279348 A1 | 11/2009 | Hirabayashi |
| 2011/0103137 A1 * | 5/2011 | Beat ......................... 365/156 |

OTHER PUBLICATIONS

International Search Report and Written Opinion—PCT/US2011/034103, ISA/EPO—Jul. 15, 2011.

* cited by examiner

SYSTEM AND METHOD TO READ A MEMORY CELL WITH A COMPLEMENTARY METAL-OXIDE-SEMICONDUCTOR (CMOS) READ TRANSISTOR

I. FIELD

The present disclosure is generally related to reading a memory cell with a complementary metal-oxide-semiconductor (CMOS) read transistor.

II. DESCRIPTION OF RELATED ART

Advances in technology have resulted in smaller and more powerful computing devices. For example, there currently exist a variety of portable personal computing devices, including wireless computing devices, such as portable wireless telephones, personal digital assistants (PDAs), and paging devices that are small, lightweight, and easily carried by users. More specifically, portable wireless telephones, such as cellular telephones and Internet Protocol (IP) telephones, can communicate voice and data packets over wireless networks. Further, many such wireless telephones include other types of devices that are incorporated therein. For example, a wireless telephone can also include a digital still camera, a digital video camera, a digital recorder, and an audio file player. Also, such wireless telephones can process executable instructions, including software applications, such as a web browser application, that can be used to access the Internet. As such, these wireless telephones can include significant computing and data storage capabilities.

The ability of a computing device, particularly a mobile device, to provide computing and data storage operation may be limited by energy consumption efficiency of components of the device. For example, a memory array of a device may include memory cells that discharge or leak during non-read operations. Reducing a geometry of the memory array may increase the leakage current. The leakage current may result in power consumption that reduces battery life of the memory array. For example, during an active mode (e.g., read operation), leakage current may represent thirty to forty percent of power used. However, the device may be idle (e.g., non-read operation) a larger percentage of the time than in the active mode. Thus, reducing leakage of memory cells during the non-active mode is desirable.

III. SUMMARY

A memory cell with a complementary metal-oxide semiconductor (CMOS) read transistor is described. The CMOS read transistor is responsive to a read word line. By maintaining a read bit line and the read word line at a common voltage during non-read operations, current leakage between the read bit line and the read word line through the CMOS read transistor may be prevented or at least significantly reduced. During a read operation, the read word line may be temporarily changed from the common voltage level to a particular voltage level. The read word line is maintained at the particular voltage level until after data stored at the storage element is sensed by the CMOS read transistor.

In a particular embodiment, a memory cell is disclosed that includes a storage element and a complementary metal-oxide-semiconductor (CMOS) read transistor. The CMOS read transistor includes a first terminal coupled to a read word line, a second terminal coupled to a read bit line, and a third terminal coupled to the storage element. During a non-read operating time, the read word line and the read bit line are both maintained at substantially the same voltage level. During a read operation, the read word line is maintained at a particular voltage level until after a voltage representing data stored at the storage element is sensed by the CMOS read transistor.

In another particular embodiment, a memory device is disclosed that includes a memory array including a plurality of memory cells. At least one of the memory cells includes a storage element and a complementary metal-oxide-semiconductor (CMOS) read transistor. The CMOS read transistor includes a first terminal coupled to a read word line, a second terminal coupled to a read bit line, and a third terminal coupled to the storage element. The at least one memory cell also includes a write bit line coupled to the storage element via an access transistor. During a non-read operating time, the read word line and the read bit line are both maintained at substantially the same voltage level. The memory device also includes control circuitry coupled to the at least one of the memory cells to select the at least one the memory cells to be read.

In another particular embodiment, a method of managing leakage of a CMOS read transistor in a memory cell is disclosed. The method includes maintaining a read word line and a read bit line coupled to the CMOS read transistor at a common voltage level during at least one memory operation. The method also includes temporarily changing the read word line from the common voltage level to a particular voltage level during a memory read operation with respect to at least one memory cell that includes the CMOS read transistor. The read word line is maintained at the particular voltage level until after data stored at the storage element is sensed by the CMOS read transistor.

In another particular embodiment, a read word line driver circuit is disclosed that includes a read word line driver. The read word line driver maintains a read word line and a read bit line coupled to a complementary metal-oxide-semiconductor (CMOS) read transistor of at least one memory cell at a common voltage level during at least one memory operation. The read word line driver temporarily changes the read word line from the common voltage level to a particular voltage level to initiate a memory read operation with respect to the at least one memory cell. The read word line driver maintains the read word line at the particular voltage level until after data stored at the storage element is sensed by the CMOS read transistor.

In a particular embodiment, an apparatus includes means for maintaining a read word line and a read bit line at a common voltage during a non-read operation. The apparatus also includes means for maintaining a particular voltage level at the read word line until after a complementary metal-oxide-semiconductor (CMOS) read transistor senses a voltage representing data from the storage element.

One particular advantage provided by at least one of the disclosed embodiments is an ability of a memory cell to reduce current leakage by controlling voltage levels applied to a CMOS read transistor during non-read operations.

Other aspects, advantages, and features of the present disclosure will become apparent after review of the entire application, including the following sections: Brief Description of the Drawings, Detailed Description, and the Claims.

V. DETAILED DESCRIPTION

Figure 1:
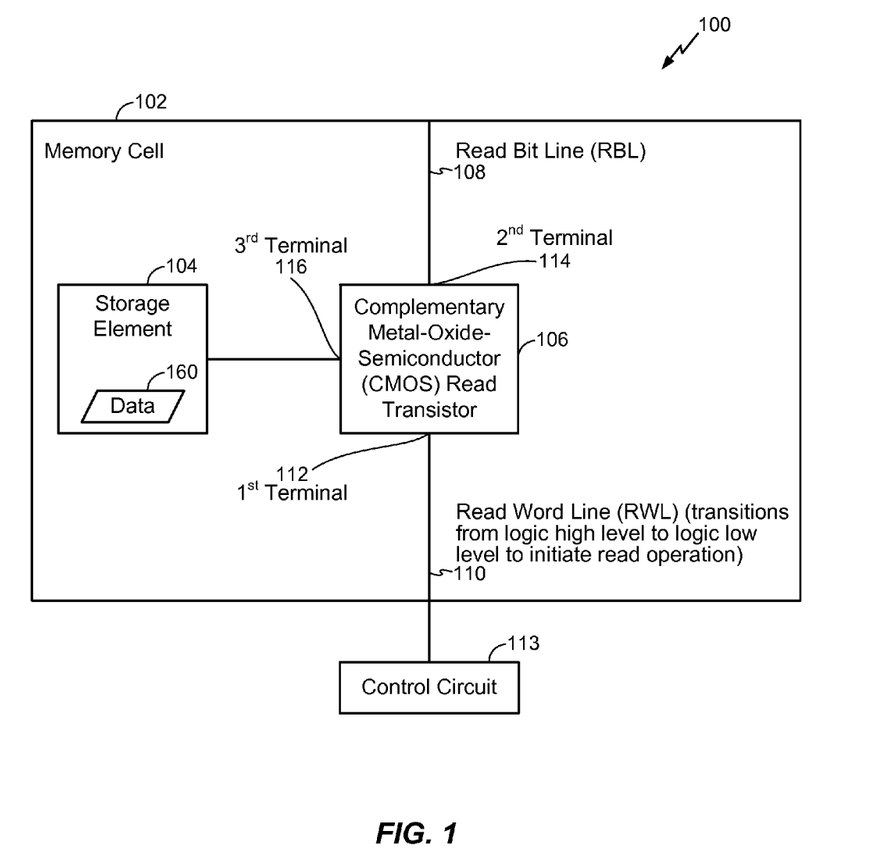
FIG. 1 is a block diagram of a particular illustrative embodiment of a system with a memory cell that includes a low-leakage complementary metal-oxide semiconductor (CMOS) read transistor.

Referring to FIG. 1, a first embodiment of a system that includes a low-leakage complementary metal-oxide semiconductor (CMOS) read transistor is depicted and generally designated 100. The system 100 includes a control circuit 113 and a memory cell 102 that includes a storage element 104 and a CMOS read transistor 106. The CMOS read transistor 106 is coupled to the control circuit 113 via a read word line 110 at a first terminal 112, to a read bit line 108 at a second terminal 114, and to the storage element 104 at a third terminal 116.

From the perspective of the CMOS read transistor 106, the memory cell 102 may be configured to operate in two states. In a first state, the memory cell 102 is being read. During a read operation of the memory cell 102, the read word line 110 and the read bit line 108 may be at different logic levels (e.g., voltage levels) in order to allow data 160 stored at the storage element 104 to be read. In a second state, the memory cell is engaged in any operation that does not involve reading. For example, in the second state, the memory cell 102 may be static, may be in a maintenance phase, or may be performing a writing operation. During the second state, (i.e., non-read operation), the read bit line 108 and the read word line 110 are maintained at a common voltage (e.g., a high logic level or a low logic level) that eliminates or substantially reduces leakage current flowing through the CMOS read transistor 106.

By maintaining the read word line 110 and the read bit line 108 at the same voltage level during times other than during a read operation, leakage through the CMOS read transistor 106 may be prevented or at least reduced during a non-read operation. For example, during a non-read operation, a voltage difference between the read word line 110 and the read bit line 108 is eliminated or reduced when both the read word line 110 and the read bit line 108 are maintained at substantially the same voltage level. By reducing or eliminating the voltage difference, current leakage between the read word line 110 and the read bit line 108 may also be eliminated or at least substantially reduced.

In a particular embodiment, the CMOS read transistor 106 is configured to control access to the storage element 104. The CMOS read transistor 106 may be an n-type FET that is connected to the storage element 104, the read bit line 108, and the read word line 110. In this case, the voltage of the storage element 104 may be used to determine in part whether a channel may form between the read bit line 108 and the read word line 110. In a particular embodiment, the CMOS read transistor 106 is a low-voltage threshold transistor.

The control circuit 113 may be configured to control the read word line 110. For example, during a non-read operation, the control circuit 113 may be configured to maintain the read word line 110 at a common voltage level with the read bit line 108. During a read operation, the control circuit 113 may be configured to transition the read word line 110 from the common voltage level to a particular voltage level to enable the read bit line 108 to transition based on the data 160 of the storage element 104. The control circuit 113 may be configured to maintain the read word line 110 at the particular voltage level until after the data 160 is sensed by the CMOS read transistor 106.

Prior to sensing a voltage representing the data 160 stored by the storage element 104, the read bit line 108 may be precharged. For example, the read bit line 108 may be precharged to the high voltage level and the read word line 110 may be transitioned to a low voltage level to initiate the read operation. The read bit line 108 may discharge when the CMOS read transistor 106 is 'on' (e.g., the data 160 is the high voltage level) and may maintain the high voltage level when the CMOS read transistor 106 is 'off' (e.g., the data 160 is the low voltage level). In this case, the control circuit 113 may maintain the read word line 110 at the low voltage level until after the CMOS read transistor 106 senses the data 160.

Alternatively, the read bit line 108 may be initialized to the low voltage level and the read word line 110 may be transitioned to a high voltage level to initiate the read operation. The read bit line 108 may charge when the CMOS read transistor 106 is 'on' (e.g., the data 160 is the high voltage level) and may maintain the low voltage level when the CMOS read transistor 106 is 'off' (e.g., the data 160 is the low voltage level). In this case, the control circuit 113 may maintain the read word line 110 at the high voltage level until after the CMOS read transistor 106 senses the data 160.

A sense amplifier may be connected to the read bit line 108 to sense a change in voltage in the read bit line 108. The sense amplifier may associate a voltage drop in the read bit line 108 with a value of the data 160 of the storage element 104. For example, a logic one may be indicated by a drop in a voltage of the read bit line 108 that exceeds a triggering voltage. As another example, the data 160 may be determined to be a logic zero if the read bit line 108 remains at the same voltage level or a voltage drop on the read bit line 108 does not exceed a triggering voltage. Alternatively, a logic one may be indicated by a rise in a voltage of the read bit line 108 and a logic zero may be indicated when the voltage level of a read bit line remains the same.

Figure 2:
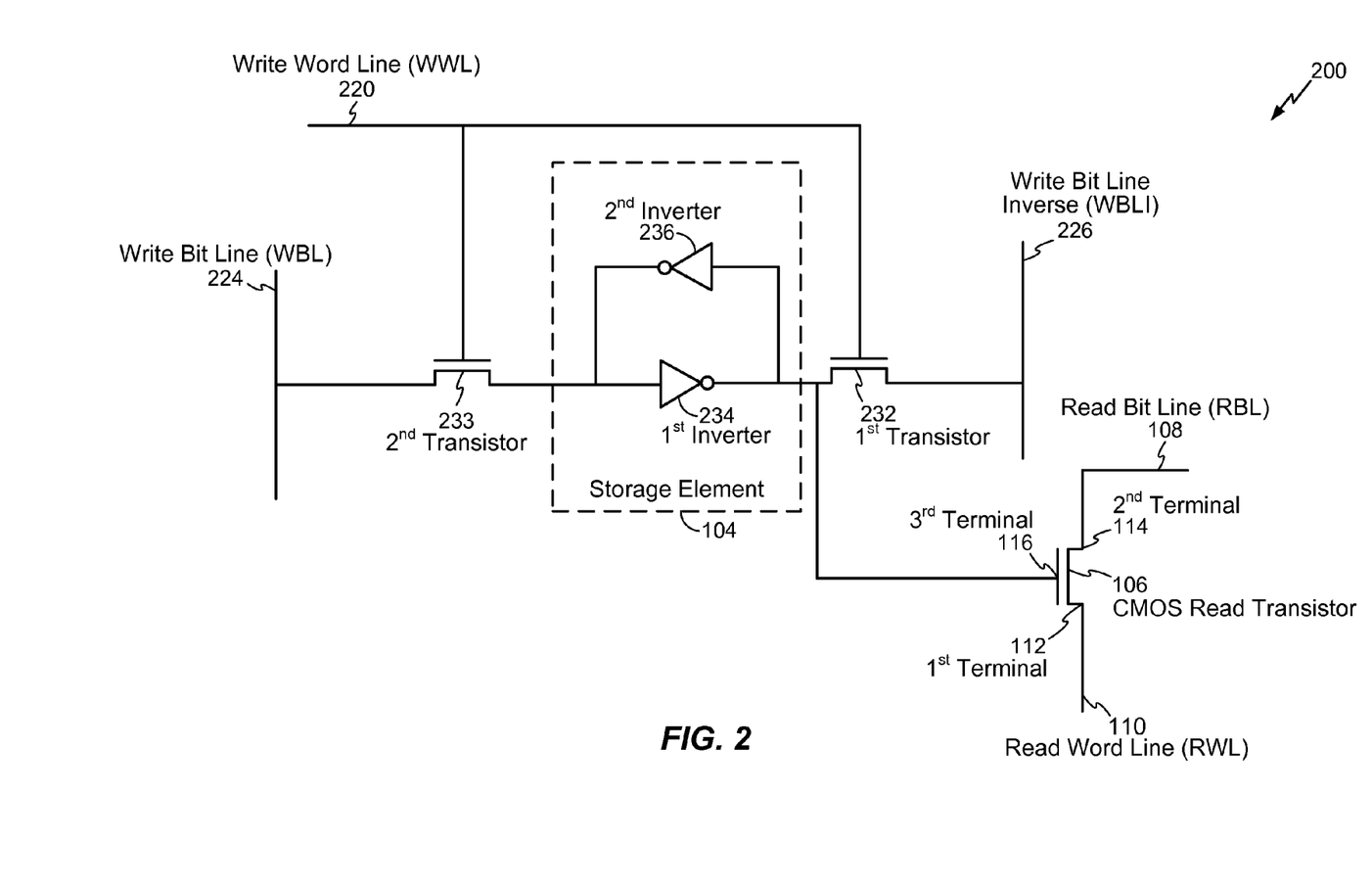
FIG. 2 is a circuit diagram of a second illustrative embodiment of a system that includes a low-leakage CMOS read transistor.

Referring to FIG. 2 a particular embodiment of a system that includes a low-leakage complementary metal-oxide semiconductor (CMOS) read transistor is depicted and generally designated 200. The system 200 includes the storage element 104 coupled to a write bit line 224, a write word line 220, and a complementary write bit line 226. The storage element 104 is also coupled to the CMOS read transistor 106, which is coupled to the read bit line 108 and the read word line 110.

The storage element 104 may include a first inverter 234 and a second inverter 236. The first inverter 234 and the second inverter 236 may be cross-coupled inverter that is not directly connected to the read word line 110. In a particular embodiment, access to the storage element 104 during a write operation is controlled by a first access transistor 232 and a second access transistor 233. The first access transistor 232 and the second access transistor 233 may be FETs that are turned 'on' or 'off' by a voltage of the write word line 220.

During a non-read operation (e.g., ideal or standby time), the read bit line 108 and the read word line 110 may be maintained at a common voltage level. Leakage current and active current may be reduced or prevented from flowing through the CMOS read transistor 106 regardless of the value of the storage element 104. For example, when the storage element 104 stores a high logic value and the read bit line 108 and the read word line 110 are at the same logic level, active current may not flow through the CMOS read transistor 106. As another example, when the storage element 104 stores a low logic value and the read bit line 108 and the read word line 110 are at the same logic level, leakage current may not flow through the CMOS read transistor 106. In this case, power loss due to current leakage may be reduced during non-read operations. Reducing power consumption of a memory cell may improve the performance of a device utilizing the memory cell.

During a read operation, the write word line 220 may be set to a low logic level to prevent writing to the storage element 104. The CMOS read transistor 106 may read the storage element 104 as described in FIG. 1 by transitioning the read bit line 110 from a high logic level to a low logic level. In this case, the read bit line 108 which is charged to a high logic level will discharge to the low logic level of the read word line 110 based on a value of data stored at the storage element 104.

Figure 3:
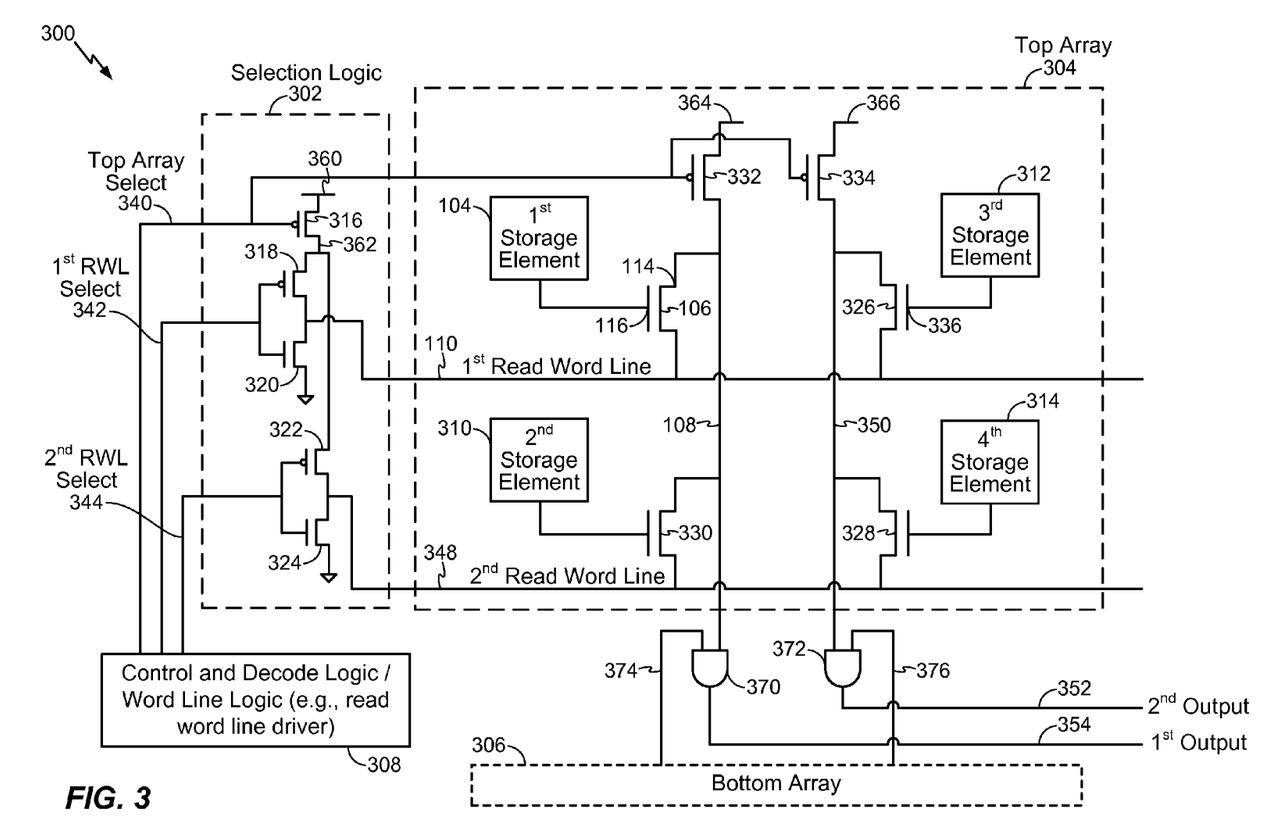
FIG. 3 is a diagram of a third illustrative embodiment of a system with a memory array that includes a low-leakage CMOS read transistor.

Referring to FIG. 3, a system is disclosed that includes a memory array (e.g., a top memory array 304) with a complementary metal-oxide semiconductor (CMOS) read transistor that is depicted and generally designated 300. The system 300 also includes a bottom array 306, selection logic 302, and control and decode logic/word line logic 308. The top array 304 includes the first CMOS read transistor 106 that is responsive to the first read word line 110 to read the first storage element 104. The top array 304 also includes a second CMOS read transistor 330 that is responsive to a second read word line 348 to read a second storage element 310. The top array 304 includes a third CMOS read transistor 326 that is responsive to the first read word line 110 to read a third storage element 312. The top array 304 also includes a fourth CMOS read transistor 328 that is responsive to the second read word line 348 to read a fourth storage element 314.

In a particular embodiment, the control and decode logic/word line logic 308 is configured to determine which storage elements are to be read during a read operation. The control and decode logic/word line logic 308 may be configured to provide signals to the selection logic 302 that may be used to control the top array 304. For example, the decode logic/word line logic 308 may transmit a top array selection signal 340 to the selection logic 302 which may be transmitted to the top array 304 to select the top array 304. The decode logic/word line logic 308 may be configured to maintain the first read word line and the first read bit line coupled to the first CMOS read transistor at a common logic level during at least one memory operation (e.g., during a non-read operation, such as a static state or a write operation) to reduce leakage of the first CMOS read transistor 106. The decode logic/word line logic 308 may also be configured to transmit a first read word line selection signal 342 which may be used by the selection logic 302 to control access to the first read word line 110. For example, the decode logic/word line logic 308 may be configured to temporarily change the first read word line 110 from the common voltage level to a particular voltage level to initiate a memory read operation with respect to the first storage element 104 of the first memory cell 102. The decode logic/word line logic 308 may also be configured to transmit a second read word line selection signal 344 to the selection logic 302 to control access or voltage levels to the second read word line 348.

In a particular embodiment, the selection logic 302 is configured to receive the top array selection signal 340, the first read word line selection signal 342 and the second read work line selection signal 344 from the control and decode logic/word line logic 308. The selection logic 302 may control the voltage levels of the first read word line 110 and the second read word line 348 via access transistors 316, 318, 320, 322, 324. For example, a combination of the top array selection signal 340, the first read word line selection signal 342, and the second read word line selection signal 344 may determine whether the first read word line 110 is at a low logic level, a high logic level, or unselected.

The top array selection signal 340 may be connected to the gate of the access transistor 316 such that when the top array selection signal 340 is at a low logic level, current may flow through the access transistor 316. In this case, the access transistor 316 is turned 'on' and current is able to flow from a voltage source 360 to the access transistor 318 and to the access transistor 322. Alternatively, when the top array selection signal 340 is at a high logic level, the access transistor 316 is turned 'off' and current does not flow. The access transistors 318, 320 may be responsive to the first read word line selection signal 342 to control a logic level of the first read word line 110 and the access transistors 322, 324 may be responsive to the second read word line selection signal 344 to control a logic level of the second read word line 348.

Before a read operation, either the first read word line 110 or the second read word line 348 is selected. The control and decode logic/word line logic 308 may perform the selection and transmit the top array selection signal 340, the first read word line selection signal 342, and the second read word line selection signal 344. If the read word line 110 is selected, the second read word line 348 may be unselected. For example, by sending the top array selection signal 340 and the first read word line selection signal 342 as a high logic level and the second read word line selection signal 344 as a low logic level, the access transistors 316, 318, and 324 are turned off and the access transistors 320 and 322 are turned on. When access transistor 318 is off and access transistor 320 is on, the first read word line 110 discharges to ground. When access transistors 322 and 316 are on and the access transistor 324 is off, the second read word line 348 is connected to the voltage source 360, which maintains the second read word line 348 at a high logic level. In addition, a low logic level top array selection signal 340 enables the access transistors 332 and 334 to be turned on which enables voltage sources 364 and 366 to precharge the first read bit line 108 and the second read bit line 350, respectively. In a particular embodiment, the voltage sources 360, 364, and 366 may be a common voltage.

To initiate the read operation, the control and decode logic/word line logic 308 may transition the top array selection signal 340 from a low logic level to a high logic level. In this case, the access transistors 332 and 334 are turned off, leaving the first read bit line 108 and the second read bit line 350 charged but no longer connected to the voltage sources 364 and 366.

In addition, when the top array selection signal 340 is at a high logic level, the access transistor 316 is turned off. When the first word line 110 is selected, the first storage element 104 and the third storage element 312 may be read, and when the second read word line 348 is selected, the second storage element 310 and the fourth storage element 314 may be read. The data stored at a particular storage element may control whether a particular read bit line is discharged or remains at a constant logic level. For example, when the first storage element 104 stores a high logic value, the CMOS read transistor 106 may be on, which enables the first read bit line 108, which is precharged at a high logic level, to discharge to the first read word line 110 that is connected to ground via the first word line 110 and the access transistor 320. The discharged read bit line 108 may be input to an AND gate 370. The AND gate 370 receives a second input 374 from the bottom array. When the bottom array is not being read, the second input 374 may be at a high logic level. Thus, a low logic level from the top array 304 and a high logic level from the bottom array 306 may generate a first output 354 that is a low logic level. In this case, a low logic level from the first output 354 may correspond with a high logic level in the first storage element 104. Coupling an inverter to a storage element (e.g., the storage element 104) or an output (e.g., the first output 354) may enable a logic level of the data stored in the storage element to correspond to a logic level of the output.

Figure 4:
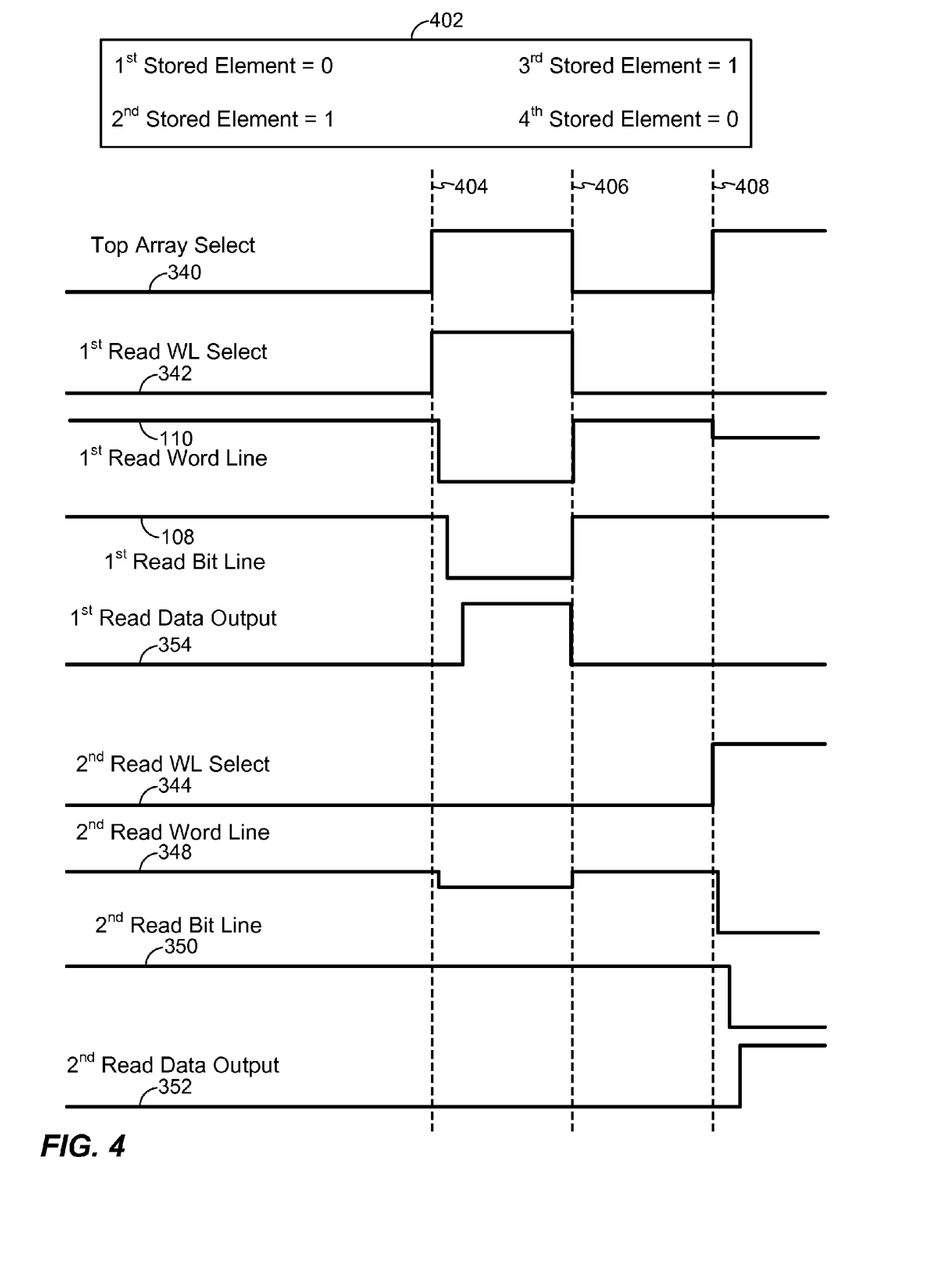
FIG. 4 is a timing diagram of a memory array that includes a low-leakage CMOS read transistor.

Referring to FIG. 4, a timing diagram to describe operation of the system 300 of FIG. 3 is disclosed and generally designated 400. The timing diagram 400 includes indications 402 of data values stored at the storage elements 104, 310, 312, 314 of FIG. 3. In this case, the first storage element 104 stores a low logic level, the second storage element 310 stores a high logic level, the third storage element 312 stores a high logic level, and the fourth storage element 314 stores a low logic level. The timing diagram 400 also includes indications of whether particular signals of FIG. 3 are at a high logic level, a low logic level, or another level.

In the time period of the timing diagram 400 before point 404, the top array selection signal 340, the first read word line selection signal 342, and the second read word line selection signal 344 received from the control and decode logic/word line logic 308 are at a low logic level which results in the first read word line 110, the second read word line 348, first read bit line 108, and the second read bit line 350 at a high logic level. The first read data output 354 and the second read data output 352 are at a low logic level.

At point 404 of the timing diagram 400, the top array selection signal 340 and the first read word line selection signal 342 transition from a low logic level to a high logic level, which indicates a read operation of storage elements on the first read word line 110 and disconnecting of the second read word line 348. The first read word line 110 transitions from high to low and the second read word line 348 discharges slightly. The first read bit line 108 discharges and the second read bit line 350 remains constant. In response, the first read data output 354 transitions from low to high and the second read data output 352 remains constant.

After the read operation is concluded, at point 406 of the timing diagram 400, the control and decode logic/word line logic 308 returns the system 300 to a non-read operation state by applying the signals that were applied prior to point 404.

At point 408 of the timing diagram 400, the top array selection signal 340 and the second read word line selection signal 344 transition from a low logic level to a high logic level, which initiates a read operation of the storage elements on the second read word line 348 and a disconnection of the first read word line 348. The second read word line 348 transitions from high to low and the first read word line 110 discharges slightly. The second read bit line 350 discharges and the first read bit line 108 remains constant. In response, the second read data output 352 transitions from low to high and the first read data output 354 remains constant.

Figure 5:
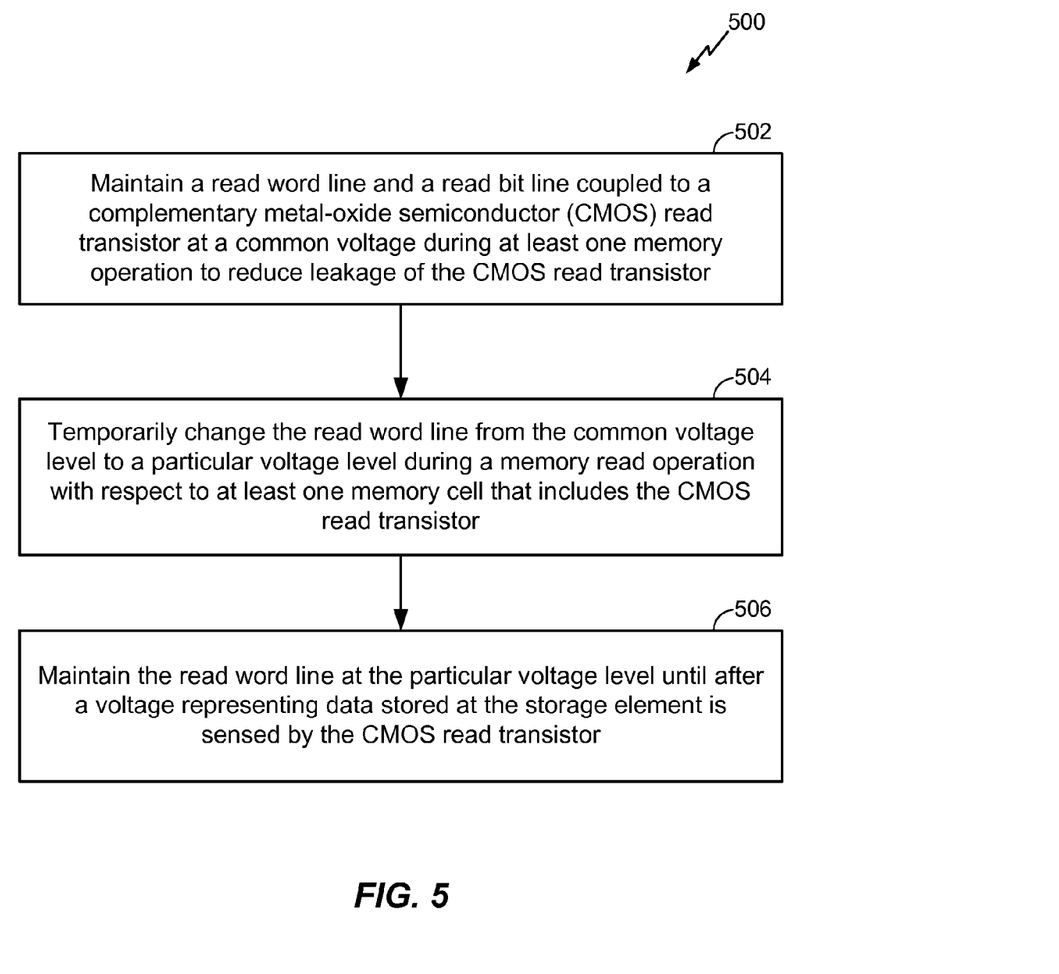
FIG. 5 is a flow chart of a particular illustrative embodiment of a method of performing a read operation using a CMOS read transistor.

Referring to FIG. 5, a method is disclosed and generally designated 500. The method 500 includes maintaining a read word line and a read bit line coupled to a complementary metal oxide semiconductor (CMOS) read transistor at a common voltage during at least one memory operation to reduce leakage of the CMOS read transistor, at 502. For example, in FIG. 1, the memory cell 102 may maintain the read word line 110 and the read bit line 108 coupled to the complementary metal oxide (CMOS) read transistor 106 at a common voltage during at least one memory operation to reduce the leakage of the CMOS read transistor 106. In this case, during a non-read operation both the read bit line 108 and the read word line 110 are maintained at the common voltage level.

The method 500 also includes temporarily changing the read word line from the common voltage level to a particular voltage level during a memory read operation with respect to at least one memory cell that includes a CMOS read transistor, at 504. For example, in FIG. 1, the memory cell 102 may temporarily change the read word line 110 from a common voltage level to a particular voltage level during a memory read operation with respect to at least one memory cell 102 that includes the CMOS read transistor 106. The method 500 may include maintaining the read word line at the particular voltage level until after a voltage representing data stored at the storage element is sensed by the CMOS read transistor, at 506. For example, in FIG. 3, the read word line 110 may not transition to a high logic level until the first output 354 is transitioned. Alternatively, the read word line 110 may not transition to a high logic level until a sense amplifier outputs a result of the sensing.

Figure 6:
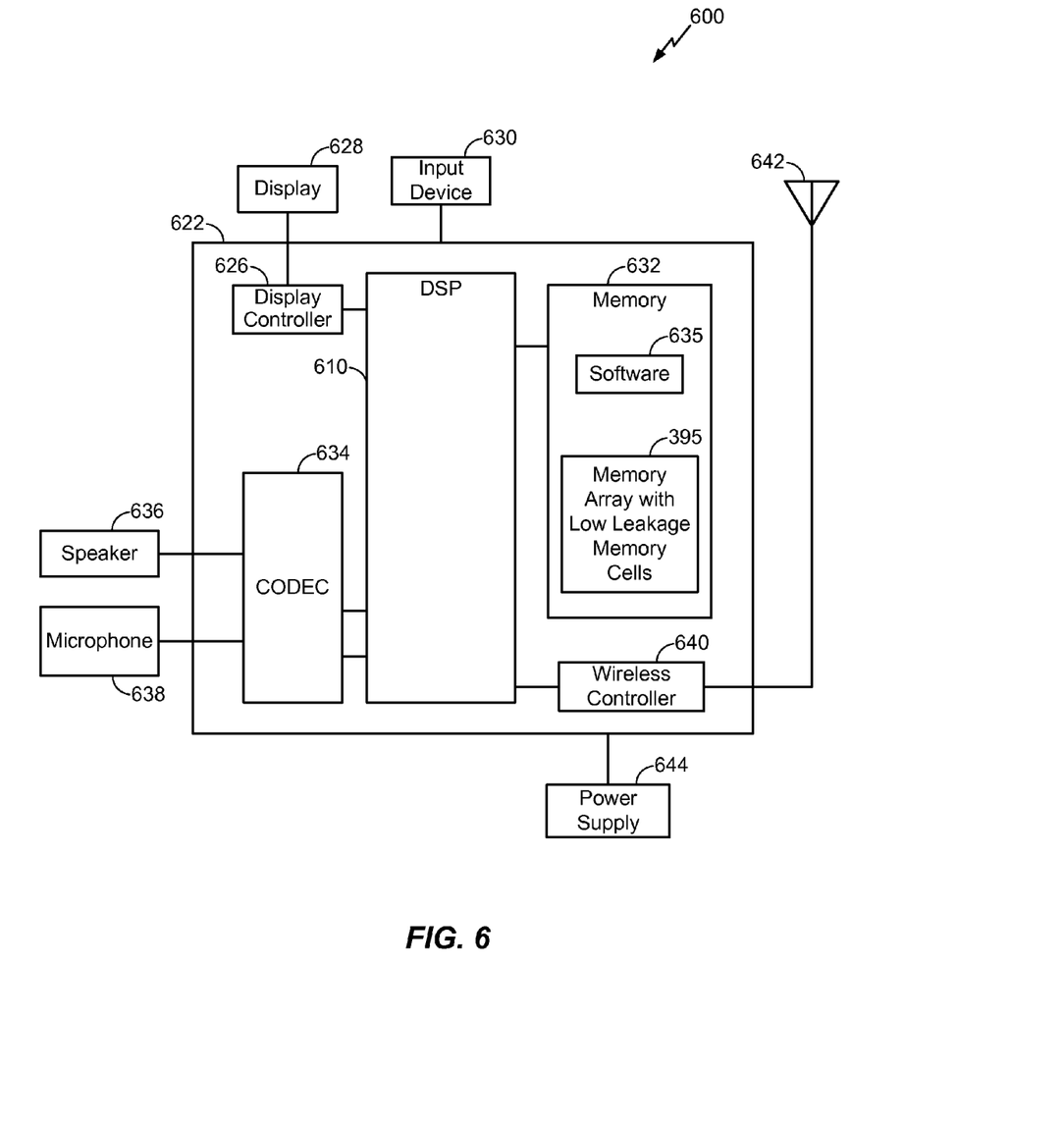
FIG. 6 is a block diagram of a particular embodiment of a wireless communication device that includes a low-leakage CMOS read transistor.

FIG. 6 is a block diagram of an embodiment of a wireless communication device 600 having a memory array with low leakage memory cells. The wireless communication device 600 may be implemented as a portable wireless electronic device that includes a processor 610, such as a digital signal processor (DSP), coupled to a memory 632.

In a particular embodiment, a display controller 626 is coupled to the processor 610 and to a display device 628. A coder/decoder (CODEC) 634 can also be coupled to the processor 610. A speaker 636 and a microphone 638 can be coupled to the CODEC 634. A wireless controller 640 can be coupled to the processor 610 and to a wireless antenna 642.

In a particular embodiment, the memory 632 may include the memory array with low leakage memory cells 395 that reduces current leakage during non-read operations. The low leakage memory cells in the memory array 395 may include the memory cell 102 of FIG. 1 which reduces current leakage by maintaining a common voltage on terminals of a CMOS read transistor within the memory cell during non-read operations. The memory array 395 or the memory cell 102 of FIG. 1 may be integrated in at least one semiconductor die. The wireless communication device 600 may be selected from the group consisting of a set top box, a music player, a video player, an entertainment unit, a navigation unit, a communications device, a personal digital assistant (PDA), a fixed location data unit, and a computer, into which the memory is integrated.

In a particular embodiment, the signal processor 610, the display controller 626, the memory 632, the CODEC 634, and the wireless controller 640 are included in a system-in-package or system-on-chip device 622. The processor 610 may be configured to maintain the read word line 110 of FIG. 1 and the read bit line 108 coupled to the CMOS read transistor 106 at a common voltage during at least one memory operation to reduce leakage of the CMOS read transistor 106. In a particular embodiment, an input device 630 and a power supply 644 are coupled to the system-on-chip device 622. Moreover, in a particular embodiment, as illustrated in FIG. 6, the display device 628, the input device 630, the speaker 636, the microphone 638, the wireless antenna 642, and the power supply 644 are external to the system-on-chip device 622. However, each of the display device 628, the input device 630, the speaker 636, the microphone 638, the wireless antenna 642, and the power supply 644 can be coupled to a component of the system-on-chip device 622, such as an interface or a controller.

The software 635 and the memory array 395 may reside in random access memory (RAM), a magnetoresistive random access memory (MRAM), a spin-torque-transfer MRAM (STT-MRAM), flash memory, read-only memory (ROM), programmable read-only memory (PROM), erasable programmable read-only memory (EPROM), electrically erasable programmable read-only memory (EEPROM), registers, hard disk, a removable disk, a compact disc read-only memory (CD-ROM), or any other form of storage medium known in the art. An exemplary storage medium is coupled to the processor such that the processor can read information from, and write information to, the storage medium. In the alternative, the storage medium may be integral to the processor. The processor and the storage medium may reside in an application-specific integrated circuit (ASIC). The ASIC may reside in a computing device or a user terminal. In the alternative, the processor and the storage medium may reside as discrete components in a computing device or user terminal.

The previous description of the disclosed embodiments is provided to enable a person skilled in the art to make or use the disclosed embodiments. Various modifications to these embodiments will be readily apparent to those skilled in the art, and the principles defined herein may be applied to other embodiments without departing from the scope of the disclosure. Thus, the present disclosure is not intended to be limited to the embodiments shown herein but is to be accorded the widest scope possible consistent with the principles and novel features as defined by the following claims.

What is claimed is:

1. An apparatus comprising:
    means for storing a first plurality of data values, the means for storing the first plurality of data values including a first storage element and a second storage element;
    means for storing a second plurality of data values;
    means for maintaining a read word line and a first read bit line at a common voltage during a non-read operation associated with the first storage element and for maintaining a particular voltage level at the read word line until after a first complementary metal-oxide-semiconductor (CMOS) read transistor senses a voltage representing data from the first storage element;
    a second read bit line coupled to a second CMOS read transistor;
    a first AND gate coupled to the first read bit line and further coupled to the means for storing the second plurality of data values; and
    a second AND gate coupled to the second read bit line and further coupled to the means for storing the second plurality of data values.

2. The apparatus of claim 1, further integrated in at least one semiconductor die.

3. The apparatus of claim 1, further integrated into a device selected from the group consisting of a set top box, a music player, a video player, an entertainment unit, a navigation unit, a communications device, a personal digital assistant (PDA), a fixed location data unit, and a computer.

4. An apparatus comprising:
    a read word line driver configured to maintain a read word line and a read bit line coupled to a complementary metal-oxide-semiconductor (CMOS) read transistor of at least one memory cell at a common voltage level during at least one non-read memory operation; and
    selection logic that includes an inverter coupled to the read word line driver and that further includes a first access transistor having a first terminal that is coupled to a power supply node, a second terminal that is coupled to the read word line driver, and a third terminal that is coupled to the inverter;
    wherein the read word line driver temporarily changes the read word line from the common voltage level to a particular voltage level to initiate a memory read operation with respect to the at least one memory cell; and
    wherein the read word line driver maintains the read word line at the particular voltage level until after a voltage representing data stored at the at least one memory cell is sensed by the CMOS read transistor.

5. The apparatus of claim 4, wherein the non-read memory operation includes any memory operation other than the memory read operation.

6. The apparatus of claim 4, integrated in at least one semiconductor die.

7. The apparatus of claim 4, further integrated into a device selected from the group consisting of a set top box, a music player, a video player, an entertainment unit, a navigation unit, a communications device, a personal digital assistant (PDA), a fixed location data unit, and a computer.

8. The apparatus of claim 4, wherein the first access transistor corresponds to a p-type metal-oxide-semiconductor field-effect transistor (pMOSFET), wherein the first terminal corresponds to a source terminal of the pMOSFET, wherein the second terminal corresponds to a gate terminal of the pMOSFET, and wherein the third terminal corresponds to a drain terminal of the pMOSFET.

9. The apparatus of claim 4, wherein the read word line driver is further configured to generate an array select signal, and wherein the second terminal is responsive to the array select signal.

10. The apparatus of claim 9, further comprising a second access transistor, wherein the second access transistor is coupled to the read bit line, wherein the second access transistor is responsive to the array select signal, wherein the second access transistor is configured to pre-charge the read bit line using a power supply voltage in response to the array select signal having a logically low value, and wherein the second access transistor is further configured to decouple the read bit line from the power supply voltage in response to the array select signal having a logically high value.

11. An apparatus comprising:
    a first memory array including a first storage element and a second storage element;
    a first complementary metal-oxide-semiconductor (CMOS) read transistor having a first terminal coupled to a read word line, a second terminal coupled to a first read bit line, and a third terminal coupled to the first storage element;
    a second CMOS read transistor coupled to the second storage element;
    logic configured to maintain the read word line and the first read bit line both at substantially the same voltage level during a non-read operating time and further configured to maintain, during a read operation, the read word line at a particular voltage level until after a voltage representing data stored at the first storage element is sensed by the first CMOS read transistor;
    a second read bit line coupled to the second CMOS read transistor;
    a first AND gate coupled to the first read bit line and further coupled to a second memory array; and
    a second AND gate coupled to the second read bit line and further coupled to the second memory array.

12. The apparatus of claim 11, wherein the read word line transitions to the particular voltage level to initiate the read operation.

13. The apparatus of claim 11, wherein the first read bit line is precharged prior to sensing the voltage representing the data stored by the first storage element.

14. The apparatus of claim 11, wherein the first storage element comprises cross-coupled inverters, and further comprising a second transistor to couple the cross-coupled inverters to a write word line and to a write bit line and further comprising a first write transistor to couple the cross-coupled inverters to a write bit line complement.

15. The apparatus of claim 14, wherein the first CMOS read transistor is coupled to the first write transistor and wherein the first CMOS read transistor is part of a seven transistor configuration.

16. The apparatus of claim 11, wherein the first CMOS read transistor is a low voltage threshold transistor.

17. The apparatus of claim 11, integrated in at least one semiconductor die.

18. The apparatus of claim 11, further integrated into a device selected from the group consisting of a set top box, a music player, a video player, an entertainment unit, a navigation unit, a communications device, a personal digital assistant (PDA), a fixed location data unit, and a computer.

19. The apparatus of claim 11, wherein the logic is further configured to maintain the first read bit line and the read word line each at a logically low voltage during the non-read operating time and prior to sensing the voltage representing the data stored by the first storage element and wherein the logic is further configured to transition the read word line from the logical low voltage to a logically high voltage prior to sensing the data stored by the first storage element.

20. The apparatus of claim 11, wherein the first memory array corresponds to a top array, wherein the second memory array corresponds to a bottom array wherein the first AND gate is configured to generate a first output having a logically high value when the first storage element and a corresponding third storage element of the bottom array each store a particular value, and wherein the second AND gate is configured to generate a second output having the logically high value when the second storage element and a corresponding fourth storage element of the bottom array each store the particular value.

21. The apparatus of claim 11, further comprising:
a first access transistor coupled to the first read bit line, wherein the first access transistor is configured to pre-charge the first read bit line prior to initiating the read operation and in response to an array select signal; and
a second access transistor coupled to the second read bit line, wherein the second access transistor is configured to pre-charge the second read bit line prior to initiating the read operation and in response to the array select signal.

22. A non-transitory computer-readable medium storing instructions executable by a processor, the non-transitory computer-readable medium comprising:
a first memory array including a first storage element configured to store a voltage representing a data value associated with the instructions and further including a second storage element;
a first complementary metal-oxide-semiconductor (CMOS) read transistor having a first terminal coupled to a read word line, a second terminal coupled to a first read bit line, and a third terminal coupled to the first storage element;
a second CMOS read transistor coupled to the second storage element;
logic configured to maintain the read word line and the first read bit line substantially at a common voltage level during a non-read operating time and further configured to maintain, during a read operation, the read word line at a particular voltage level until after the voltage representing the data value is accessed using the first CMOS read transistor;
a second read bit line coupled to the second CMOS read transistor;
a first AND gate coupled to the first read bit line and further coupled to a second memory array; and
a second AND gate coupled to the second read bit line and further coupled to the second memory array.

23. A method of managing leakage of a complementary metal-oxide-semiconductor (CMOS) read transistor in a first memory cell of a first memory array, the method comprising:
maintaining a read word line and a read bit line coupled to the CMOS read transistor at a common voltage level during at least one non-read memory operation associated with the first memory cell;
temporarily changing the read word line from the common voltage level to a particular voltage level to initiate a memory read operation with respect to the first memory cell;
wherein the read word line is maintained at the particular voltage level until after a first data value stored at the first memory cell is sensed by the CMOS read transistor;
generating a first output at a first AND gate based on the first data value and further based on a second data value sensed from a second memory cell of a second memory array that is coupled to the first AND gate; and
generating a second output at a second AND gate based on a third data value sensed from a third memory cell of the first memory array and further based on a fourth data value sensed from a fourth memory cell of the second memory array.

24. The method of claim 23, wherein the read bit line discharges based on a voltage level stored by the first memory cell.

25. The method of claim 23, wherein the at least one non-read memory operation includes a write memory operation associated with the first memory cell, the method further comprising:
prior to initiating the write memory operation, maintaining a write word line coupled to the first memory cell at a low logic level; and
transitioning the write word line from the low logic level to a high logic level to initiate the write memory operation.

* * * * *